(12) United States Patent
Takemura

(10) Patent No.: US 11,955,311 B2
(45) Date of Patent: Apr. 9, 2024

(54) ION BEAM IRRADIATION APPARATUS AND PROGRAM THEREFOR

(71) Applicant: NISSIN ION EQUIPMENT CO., LTD., Koka (JP)

(72) Inventor: Shinya Takemura, Shiga (JP)

(73) Assignee: NISSIN ION EQUIPMENT CO., LTD., Koka (JP)

( * ) Notice: Subject to any disclaimer, the term of this patent is extended or adjusted under 35 U.S.C. 154(b) by 113 days.

(21) Appl. No.: 17/835,875

(22) Filed: Jun. 8, 2022

(65) Prior Publication Data

US 2022/0301817 A1    Sep. 22, 2022

Related U.S. Application Data

(63) Continuation-in-part of application No. 16/801,689, filed on Feb. 26, 2020, now Pat. No. 11,462,385.

(30) Foreign Application Priority Data

Mar. 25, 2019 (JP) ................................. 2019-057092
Oct. 28, 2019 (JP) ................................. 2019-194959

(51) Int. Cl.
*H01J 37/08* (2006.01)
*G06N 20/00* (2019.01)
*H01J 37/304* (2006.01)
*H01J 37/305* (2006.01)
*H01J 37/317* (2006.01)

(52) U.S. Cl.
CPC .......... *H01J 37/3056* (2013.01); *G06N 20/00* (2019.01); *H01J 37/08* (2013.01); *H01J 37/304* (2013.01); *H01J 37/3171* (2013.01)

(58) Field of Classification Search
CPC ...... H01J 37/30253; H01J 37/08; G06N 5/04; G06N 20/00
See application file for complete search history.

(56) References Cited

U.S. PATENT DOCUMENTS

2021/0104375 A1    4/2021    Geurts et al.

FOREIGN PATENT DOCUMENTS

JP    2007-035370 A    2/2007

*Primary Examiner* — Joseph L Williams
(74) *Attorney, Agent, or Firm* — Sughrue Mion, PLLC

(57) ABSTRACT

An ion beam irradiation apparatus includes modules for generating an ion beam according to a recipe, and a control device. The control device receives the recipe including a processing condition for new processing, reads, from a monitored value storage, a monitored value that indicates a state of a module during a last processing immediately before the new processing, inputs the processing condition and the monitored value to a trained machine learning algorithm and receives, as an output from the trained machine learning algorithm, an initial value for the module, and outputs the initial value to the module to set up the module for generating the ion beam.

20 Claims, 14 Drawing Sheets

ION BEAM IRRADIATION APPARATUS AND PROGRAM THEREFOR

CROSS-REFERENCE TO RELATED APPLICATION

This application is a Continuation-in-Part Application of U.S. application Ser. No. 16/801,689, filed Feb. 26, 2020, now U.S. Pat. No. 11,462,385, which claims priority from Japanese Patent Application No. 2019-057092, filed in the Japanese Patent Office on Mar. 25, 2019, and Japanese Patent Application No. 2019-194959, filed in the Japanese Patent Office on Oct. 28, 2019, the entire contents of each of which are herein incorporated by reference in their entireties.

BACKGROUND

1. Field

The present disclosure relates to an ion beam irradiation apparatus and a program therefor.

2. Description of Related Art

An ion implantation apparatus is equipped with a plurality of modules for generating an ion beam, and each module typically is set up based on various preliminarily set basic operation parameters.

Typically, an initial value is preliminarily stored in a memory according to a recipe for the processing, or a value used during a previous set up under the same recipe is used as an initial value in a later set up procedure.

However, there is a disadvantage in that, if a state of a module changes due to degradation or maintenance such that the state is different from the previous processing, a setup time period to obtain the adjusted value can be extended, or the quality of an ion beam can be changed, even when the same recipe is used to in the set up procedure and a same value is input as the initial value.

SUMMARY

It is an aspect to provide an ion beam irradiation apparatus to make it possible to adequately determine an initial value in a set up procedure for a module to allow a setup time period to be shortened.

It is another aspect to provide an ion beam irradiation apparatus that allows a desired ion beam to be generated more efficiently.

According to an aspect of one or more embodiments, there is provided an ion beam irradiation apparatus comprising a plurality of modules for generating an ion beam according to a recipe; and a control device configured to receive the recipe including a processing condition for new processing, read, from a monitored value storage, a monitored value that indicates a state of a module of the plurality of modules during a last processing immediately before the new processing, input the processing condition and the monitored value to a trained machine learning algorithm and receive, as an output from the trained machine learning algorithm, an initial value for the module, and output the initial value to the module to set up the module for generating the ion beam.

According to another aspect of one or more embodiments, there is provided a non-transitory computer readable storage medium storing program code which, when executed by at least one central processing unit (CPU) of an ion beam irradiation apparatus that includes a plurality of modules for generating an ion beam according to a recipe, causes the CPU to receive the recipe including a processing condition for new processing, read a monitored value that indicates a state of a module of the plurality of modules during a last processing immediately before the new processing, input the processing condition and the monitored value to a trained machine learning algorithm and receive, as an output from the trained machine learning algorithm, an initial value for the module, and output the initial value to the module to set up the module for generating the ion beam.

According to another aspect of one or more embodiments, there is provided a system comprising a plurality of ion implanters and an off-site device. Each ion implanter comprises a plurality of modules and each ion implanter is configured to setup at least one module of the plurality of modules according to an initial value obtained from a trained machine learning algorithm based on a processing condition for a new processing and a monitored value that indicates a state of the at least one module during a last processing immediately before the new processing, and store learning data including the processing condition, the initial value, and an adjusted value obtained by adjusting the initial value during the setup, in association with each other. The off-site device is communicatively coupled to the plurality of the ion implanters, and is configured to receive the learning data from at least one of the plurality of ion implanters and generate the trained machine learning algorithm based on the learning data.

BRIEF DESCRIPTION OF THE DRAWINGS

The above and/or other aspects will become apparent and more readily appreciated from the following description of embodiments, taken in conjunction with the accompanying drawings of which.

DETAILED DESCRIPTION

Figure 1:
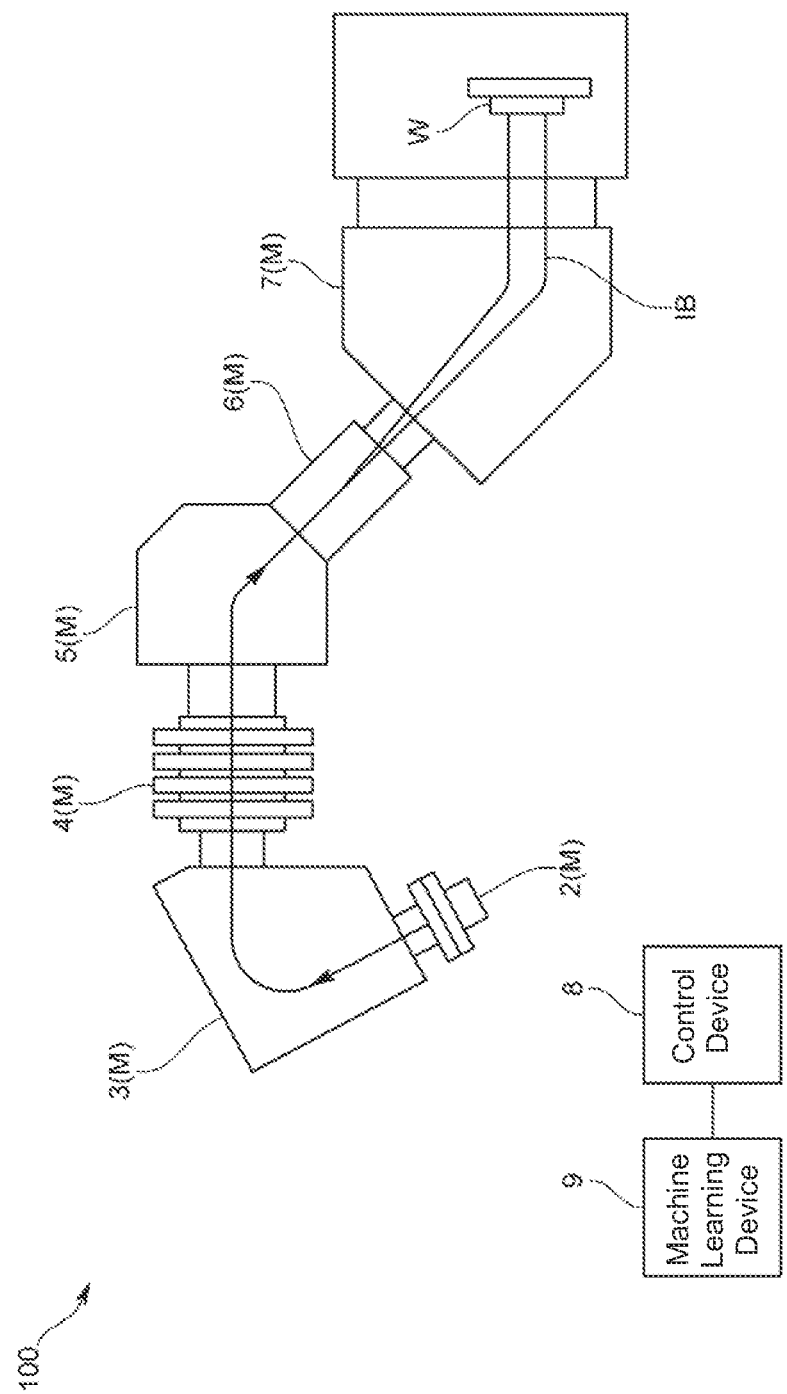
FIG. 1 is a schematic diagram showing a configuration of an ion beam irradiation apparatus according to an embodiment.

An ion implantation apparatus is equipped with a plurality of modules for generating an ion beam, such as an ion source and a mass separation magnet. Each module is configured or set up to operate based on various preliminarily-set basic operation parameters, as disclosed in, for example, JP 2007-035370 A, which is incorporated by reference here in its entirety.

Specifically, according to a "recipe", an initial value of one or more basic operation parameters is input to each of the modules, the apparatus is operated using the initial value, and information regarding an ion beam generated using the initial value is detected and the initial value is adjusted so as to allow the ion beam to be generated in conformity to the recipe, thereby setting up the module.

As an initial value of the one or more basic operation parameters, a value preliminarily stored in a memory or the like may be input according to each recipe, or a value used during previous processing under the same recipe may be input.

However, if a state of a module changes due to degradation of the module over time, or a maintenance state of the module changes, such that the state is different from the previous processing, a setup time period to obtain the adjusted value can be extended, and/or the quality of an ion beam such as a beam current amplitude, a beam angle and a beam current density can be changed, even in a situation where the same recipe is used, and the same value is input as the initial value.

According to various embodiments disclosed herein, there is also provided an ion beam irradiation apparatus that includes a machine learning part that generates a learning algorithm using, as an explanatory variable, a processing condition during new processing (e.g., from a recipe) and a monitored value indicative of a state of a module during processing immediately before the new processing (i.e., detected from the module) and an output part that uses the learning algorithm to output an initial value of a basic operation parameter for controlling an operation of the module.

In the ion beam irradiation apparatus according to various embodiments, a trained machine learning algorithm using, as an explanatory variable, a monitored value indicative of a state of a module during processing immediately before the new processing (hereinafter referred to as "last processing") is used, so that an initial value of a basic operation parameter to be output using the trained machine learning algorithm is set in consideration of the state of at least one of the modules, just before entering the new processing. Thus, the use of the trained machine learning algorithm makes it possible to adequately determine an initial value of each basic operation parameter appropriate to a current module state, such as an initial value allowing a setup time period to be shortened, and/or an initial value allowing a desired ion beam to be generated more efficiently.

The initial value may be input to a respective one of the modules, and the respective one of the modules may be operated based on an adjusted value obtained by adjusting the initial value, and the ion beam irradiation apparatus may further include a learning data storage part to store therein learning data obtained from a plurality of previous processings. The learning data may include a plurality of data sets in each of which the processing condition in each of the processings, at least one of the initial value and the adjusted value for the respective one of the modules in each of the processings, the monitored value of the at least one module during processing just before each of the processings, and an actual value of a given objective variable in each of the processings are associated with each other. In some embodiments, the ion beam irradiation apparatus may output the learning data that is stored in the learning data storage part to another ion beam irradiation apparatus, or to a central site such as, for example, another computing system and/or a cloud computing system. In some embodiments, the ion beam irradiation apparatus may output the learning data periodically. In other embodiments, the ion beam irradiation apparatus may output the learning data at the request of another ion beam irradiation apparatus, a central site, an another computing system, and/or a cloud computing system.

In some embodiments, the trained machine learning algorithm may be generated using, as an explanatory variable, a processing condition during new processing (e.g., from a recipe) and a monitored value indicative of a state of a module during processing immediately before the new processing. For example, the trained machine learning algorithm may be generated through machine learning using the learning data that is stored in the learning data storage part of the ion beam irradiation apparatus. In other embodiments, the trained machine learning algorithm may be generated from learning data from one or more additional ion beam irradiation apparatuses in addition to the learning data that is stored in the learning data storage part of the ion beam irradiation apparatus. For example, the ion beam irradiation apparatus may be communicatively coupled one or more additional ion beam irradiation apparatuses, and the machine learning part of the ion beam irradiation apparatus may receive learning data from the one or more additional ion beam irradiation apparatuses and generate the trained machine learning algorithm through machine learning using the learning data stored in the learning data storage part of the ion beam irradiation apparatus (i.e., its own learning data) and the learning data received from the one or more additional ion beam irradiation apparatuses.

Examples of the explanatory variable may include a setup time period until the adjusted value is obtained; an index value indicative of whether or not the adjusted value is obtained; a beam current amplitude of the ion beam; a beam angle of the ion beam; and/or a beam current density of the ion beam. In some contexts, the term "explanatory variable" may be alternatively be referred to as a training variable or input data that is used to train an artificial intelligence (AI) engine (see FIG. 6), as discussed further below. Further, the explanatory variable may be changed depending on the objective variable.

Among the plurality of modules, an ion source system-module is often short in terms of usable life, as compared to an extraction electrode system-module and a beam line electromagnetic field system-module, which means that the ion source system-module is high in terms of maintenance or exchange frequency, as compared to the extraction electrode system-module and the beam line electromagnetic field system-module. In view of this, the learning data may include a monitored value of at least the ion source system-module. In this case, the machine learning can be performed in consideration of a state of the last processing in the ion source system-module whose state is most likely to change among the modules, so that it is possible to more adequately determine the initial value during new processing.

Plasma which is generated in an ion source involves difficulty in modeling and in control. Examples of a parameter having a dominant influence on efficiency of plasma generation include a flow rate of gas to be supplied to a plasma chamber constituting the ion source module, and a supply current to be supplied to a source magnet for generating a magnetic field inside the plasma chamber. Therefore, as the basic operation parameter, it may be advantageous to use at least one of a flow rate of a gas to be supplied to the plasma chamber constituting the ion source module, and a supply current to be supplied to the source magnet for generating a magnetic field inside the plasma chamber. This makes it possible to adequately determine respective initial values of the gas flow rate and the supply current to the source magnet, so as to efficiently generate plasma.

The ion beam irradiation apparatus may further include a control device operable to, based on the processing condition and a given setup sequence, select an initial value of the basic operation parameter, input the selected initial value to the respective one of the modules, and adjust the input initial value, thereby setting up the respective one of the modules, and a recovery part to, when the setup of the respective one of the modules by the control device fails to be completed, acquire an abnormal signal indicative of that fact, wherein the ion beam irradiation apparatus is configured such that, in response to a situation where the recovery part acquires the abnormal signal, the initial value of the basic operation parameter output from the machine learning part is input to the respective one of the modules.

According to this feature, it is possible to use the initial value obtained through the trained machine learning algorithm, without largely modifying an existing module setup sequence, and achieve further shortening of the setup time period and further improvement in setup success rate.

The ion beam irradiation apparatus may further include a control device operable to, based on the processing condition and a given setup sequence, select an initial value of the basic operation parameter, input the selected initial value to the respective one of the modules, and adjust the input initial value, thereby setting up the respective one of the modules, and an advance prediction part to, when using the initial value selected based on the processing condition and the setup sequence, predict whether or not the setup of the respective one of the modules will be completed, wherein the ion beam irradiation apparatus is configured such that, in response to a situation where the advance prediction part predicts that the setup of the respective one of the modules will not be completed, the initial value of the basic operation parameter output from the machine learning part is input to the respective one of the modules.

There may also be provided a computer readable storage medium storing program code for use in an ion beam irradiation apparatus for generating an ion beam meeting a processing condition by a plurality of modules and irradiating a workpiece with the ion beam. The program code when executed by a computer, such as a central processing unit (CPU) or a microprocessor, may perform the functions of a control device to input at least a processing condition during new processing and a monitored value indicative of a state of at least one of the modules during processing just before the new processing to a trained machine learning algorithm and receive as an output from the trained machine learning algorithm an initial value of each basic operation parameter for controlling an operation of a respective one of the modules, and to output the initial value of each basic operation parameter for controlling an operation of a respective one of the modules, to the respective one of the modules.

There may also be provided a computer readable storage medium storing program code for use in an ion beam irradiation apparatus for generating an ion beam meeting a processing condition by a plurality of modules and irradiating a workpiece with the ion beam. The program code when executed by a computer, such as a central processing unit (CPU) or a microprocessor, may perform the functions of a machine learning part to update a learning algorithm using, as an explanatory variable, at least a processing condition during new processing and a monitored value indicative of a state of at least one of the modules during processing just before the new processing, and an output part to use the learning algorithm to output an initial value of each basic operation parameter for controlling an operation of a respective one of the modules.

According to some embodiments disclosed herein, it is possible to perform machine learning in consideration of the state of at least one of the modules during a last processing, and thus adequately determine an initial value of each basic operation parameter during new processing, according to an explanatory variable.

With reference to the drawings, various embodiments will now be described. In this specification, the phrase "at least one of A or B" includes "only A", "only B", and "both A and B".

FIG. 1 is a schematic diagram showing a configuration of an ion beam irradiation apparatus according to an embodiment. An ion beam irradiation apparatus 100 is an ion implantation apparatus for irradiating a target W with an ion beam IB to implant ions into the target W. The ion beam irradiation apparatus 100 includes a plurality of modules which are used for generating the ion beam IB. The plurality of modules may include an ion source 2, a mass separation magnet 3, an acceleration tube 4, an energy separation magnet 5, a scanning magnet 6, and a beam parallelizing magnet 7, and a control device 8 for controlling operations of the modules 2 to 7, as shown in FIG. 1. The ion beam irradiation apparatus 100 is illustrated in FIG. 1 but embodiments are not limited an ion implantation apparatus. For example, in some embodiments, the apparatus may be an ion beam etching apparatus.

Specifically, the ion beam irradiation apparatus 100 may include the ion source 2 from which the ion beam IB is extracted, the mass separation magnet 3 provided downstream of the ion source 2 to serve as a mass separator that sorts out, from the ion beam IB extracted from the ion source 2, desired dopant ions identified by a mass number and a valence, and outputs the sorted dopant ions. The ion beam irradiation apparatus 100 may further comprise an acceleration tube 4 provided downstream of the mass separation magnet 3 to accelerate or decelerate the ion beam IB output from the mass separation magnet 3, the energy separation magnet 5 provided downstream of the acceleration tube 4 to serve as an energy separator that sorts out ions having a specific energy from the ion beam IB output from the acceleration tube 4, and outputs the sorted ions, the scanning magnet 6 provided downstream of the energy separation magnet 5 to scan the ion beam IB output from the energy separation magnet 5, magnetically and one-dimensionally (in a direction along the drawing sheet in FIG. 1), and the beam parallelizing magnet 7 provided downstream of the scanning magnet 6 to bend back the ion beam IB output from the scanning magnet 6 so as to become parallel to a reference axis, thereby performing parallel scanning of the ion beam IB in cooperation with the scanning magnet 6. In this specification, each of the above components will be referred to as "module" (hereinafter written as "module M").

The ion beam irradiation apparatus 100 illustrated in FIG. 1 is an example, and in some embodiments, one or more of the modules M may be omitted. For example, in a case where the ion beam irradiation apparatus 100 is configured to irradiate the target W with a ribbon beam having a size greater than that of the target W, in a direction orthogonal to a mechanical scanning direction of the target W, the scanning magnet 6 may be omitted, and one or more of the remaining modules M such as the acceleration tube 4, the energy separation magnet 5 and the beam parallelizing magnet 7 may be appropriately used.

Figure 2:
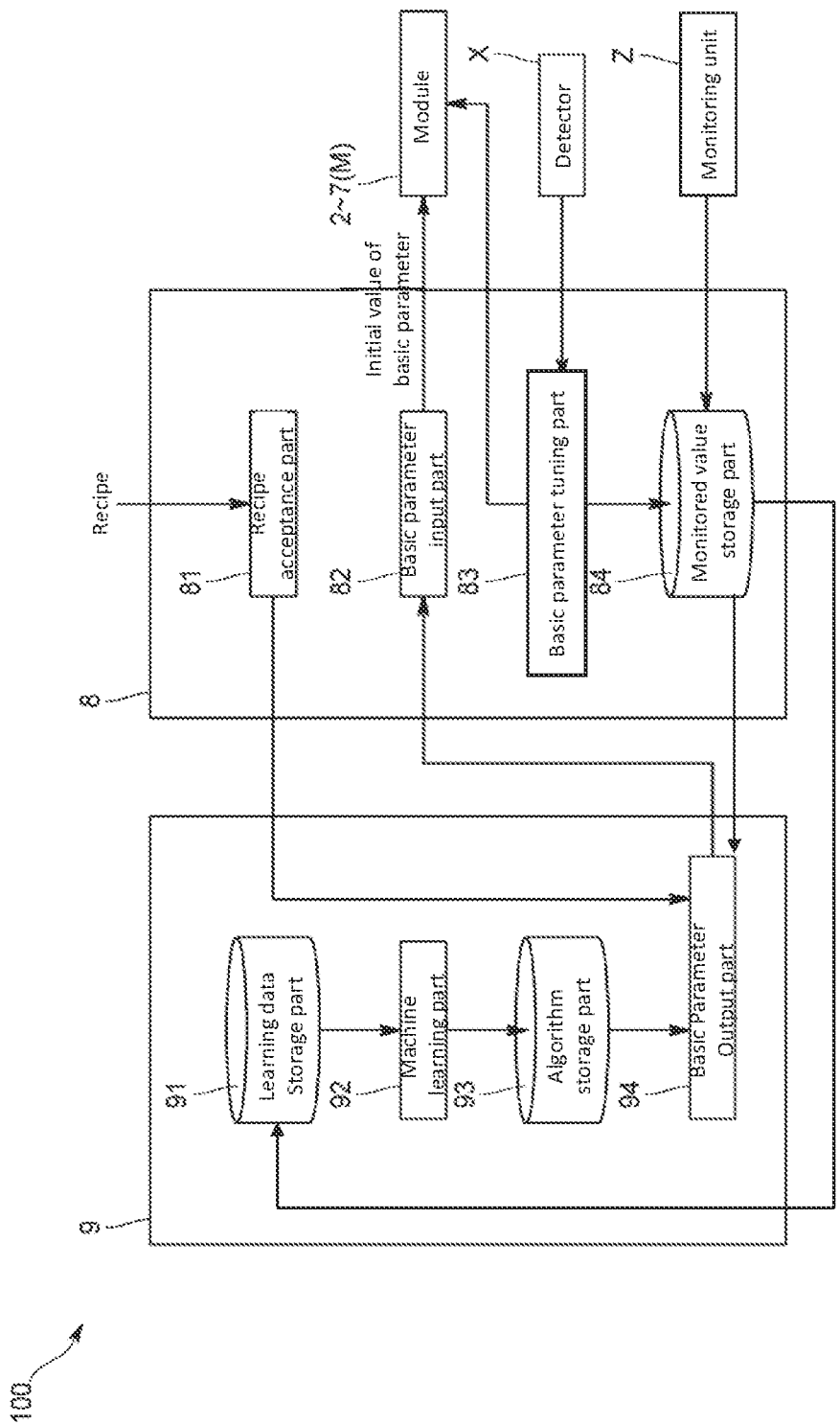
FIG. 2 is a functional block diagram showing functions of a control device and a machine learning device, according to an embodiment.

FIG. 2 is a functional block diagram showing functions of a control device and a machine learning device, according to an embodiment.

The control device 8 is a computer comprising at least one CPU, a memory, a display, and input means, such as a keyboard, mouse, trackpad, touch screen display, etc., and is configured to, when the CPU and its peripherals are cooperatively operated according to control program code stored in the memory, execute the control program code to function as a recipe acceptance part 81, a basic operation parameter input part 82 (hereinafter referred to simply as "basic parameter input part 82"), and a basic operation parameter tuning part 83 (hereinafter referred to simply as "basic parameter tuning part 83"), as shown in FIG. 2.

The recipe acceptance part 81 accepts a processing condition for processing to a workpiece (i.e., a to-be-processed object). In this specification, the processing condition will hereinafter be referred to as "recipe".

The recipe is data which is transmitted from, e.g., a host computer or the like (not shown) that is communicatively coupled to the ion beam irradiation apparatus. The recipe includes a variety of information indicative of the quality of the ion beam IB generated by the ion beam irradiation apparatus 100 such as an ion species of dopant ions included in the ion beam IB, a beam energy of the ion beam IB, and/or a beam current of the ion beam IB.

The basic parameter input part 82 is operable to input an initial value of each basic operation parameter (hereinafter referred to as "basic parameter") for controlling an operation of a respective one of the modules M, to the respective one of the modules M. In some embodiments, the initial value may be the initial value output from the machine learning part. That is, the basic parameter input part 82 of the control device 8 may access the machine learning part in order to receive the initial value. Here, the basic parameter refers to a setting item used to control an operation of the respective one of the modules M, and is preliminarily set with respect to the respective one of the modules M. One type of basic parameter may be set with respect to each of the modules M, or a plurality of types of basic parameters may be set with respect to each of the modules M. In other words, for each module M, there may be one basic parameter or a plurality of basic parameters, and each basic parameter may have an initial value.

The modules M constituting the ion beam irradiation apparatus 100 may be roughly classified into an ion source system-module that generates plasma, an extraction electrode system-module that extracts the ion beam IB from the ion source 2, and a beam line electromagnetic field system-module that controls the extracted ion beam IB.

Examples of the ion source system-module may include a plasma chamber constituting the ion source 2; a gas supply mechanism (e.g., a flow rate control device, etc.) that supplies a plasma generating gas to the plasma chamber; a source magnet that forms a magnetic field inside the plasma chamber; and a filament that emits electrons into the plasma chamber.

Further, examples of the basic parameter set for the ion source system-module may include a flow rate of gas to be supplied to the plasma chamber; a supply current to be supplied to the source magnet; and/or an arc current.

Examples of the extraction electrode system-module may include a suppression electrode and a ground electrode constituting an extraction electrode system that extracts the ion beam IB from the ion source 2; and an adjustment mechanism that adjusts positions of these electrodes, such as an inter-electrode distance thereof, etc.

Further, examples of the basic parameter set for the extraction electrode system-module may include a distance from the plasma chamber to each of the electrodes along a beam extraction direction; a position of each of the electrodes; and/or an inclination of each of the electrodes.

Example of the beam line electromagnetic field system-module may include the mass separation magnet 3, the acceleration tube 4, the energy separation magnet 5, the scanning magnet 6, and/or the beam parallelizing magnet 7.

Further, examples of the basic parameter set for the beam line electromagnetic field system-module may include a magnetic flux density of the mass separation magnet 3, a voltage to be applied to the acceleration tube 4, a magnetic flux density of the energy separation magnet 5, and/or a magnetic flux density of the beam parallelizing magnet 7.

The basic parameters enumerated above are not always entirely necessary, and in some embodiments, some of the basic parameters may be omitted. That is, the basic parameters may be appropriately shifted, according to the configuration of the ion beam irradiation apparatus 100, or the like.

The basic parameter tuning part 83 is operable to adjust (tune) the initial value of each basic parameter input to the basic parameter input part 82. Specifically, the basic parameter tuning part 83 may adjust the initial value of each of one or more basic parameters on a case-by-case basis so as to allow a generated ion beam 1B to meet a processing condition, i.e., so as to allow an ion beam 1B to be generated in conformity to the recipe, thereby setting up the respective one of the modules M.

More specifically, the basic parameter tuning part 83 is configured to adjust the basic parameter in accordance with a preliminarily set setup sequence. Then, each of the modules M is operated based on an adjusted value of the basic parameter finally obtained through the setup sequence. As used in this specification, the adjusted value includes a value obtained by adjusting the initial value, and the initial value which has not been adjusted.

For example, the setup sequence may include a plurality of steps. According to an embodiment, the setup sequence may include a plasma generation step of generating plasma inside the plasma chamber; an extraction step of extracting an ion beam IB by the extraction electrode system; a beam adjustment step of performing acceleration/deceleration and trajectory adjustment of the ion beam IB; and a beam measurement step of measuring a beam current magnitude, a beam angle, a beam current density or the like of the ion beam IB. As shown in FIG. 2, one or more detectors X, such as a beam detector (e.g., a Faraday cup), may be provided to detect various detection values of the ion beam IB. The detected values are then fed back to the basic parameter tuning part 83. The basic parameter tuning part 83 is operable to feedback-control the value of the basic parameter such that a detection value detected in each step by each of various detectors X such as a beam detector (e.g., Faraday cup) converges to a given target value.

As shown in FIG. 2, the ion beam irradiation apparatus 100 may further include a monitored value storage part 84 that stores a value of a state parameter indicative of the state of at least one of the modules M (the value of the state parameter indicative of the state of at least one of the modules M will hereinafter be referred to as "monitored value").

Figure 14:
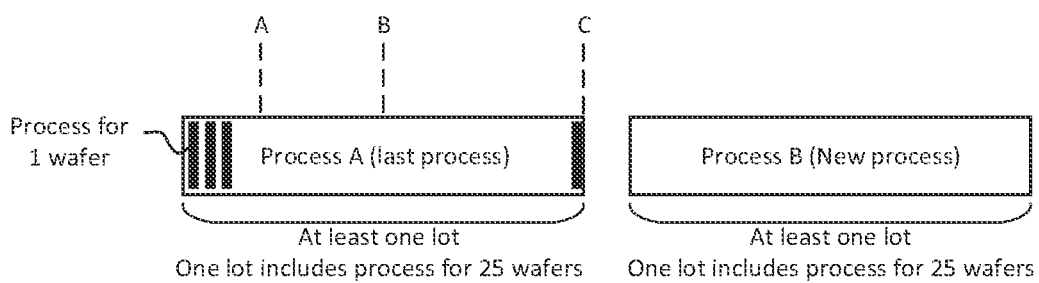
FIG. 14 is a diagram illustrating a last process immediately before a new process, according to an embodiment.

For example, as illustrated in FIG. 14, the monitored value will change in response to, for example, monitoring items during the process, a processing time, and/or a degree of consumption of items. As an example, FIG. 14 illustrates a Process A corresponding to a last process immediately before a Process B corresponding to a new process. As shown in FIG. 14, the Process A may include processing of at least one lot of wafers, where the one lot, for example, includes 25 wafers. However, embodiments are not limited to one lot having 25 wafers, and in some embodiments, the lot size may be different. As illustrated in FIG. 14, each vertical bar illustrates a process for one wafer. The monitored values may be stored at different points, e.g., A, B, and/or C during the Process A in the example illustrated in FIG. 14. It is advantageous to store monitored values taken late in the Process A, for example, in the last quartile of the processes performed on the wafers. For example, in a case where one lot includes 25 wafers, the monitored value for one of the $19^{th}$ wafer to the $25^{th}$ wafer may be stored. In another embodiment, the monitored value taken, for example, at point C which is a monitored value after the last process for the last wafer in the Process A (i.e., the $25^{th}$ wafer) may be stored, because the monitored values are not changed any more at the end of the Process A.

Here, even in a situation where the same recipe is received and used, and the same value is input as the initial value of the basic parameter, the adjusted value obtained by the basic parameter tuning part 83 may vary depending on the state of the at least one module M at that time. In this embodiment, the state parameters may include all or a portion of the basic parameters, and the monitored value may include all or a portion of the adjusted values of the basic parameters. Specifically, all or a portion of the adjusted values obtained by the basic parameter tuning part 83 may be stored as the monitored values in the monitored value storage part 84.

Further, other than the basic parameters, the state parameters may include a parameter varying during processing, i.e., a parameter having a difference before and after one or more processing cycles. Examples of this type of state parameter include a filament current and a filament voltage. Differently from the basic parameter whose initial value is input, the state parameter is a variable which varies. For example, in the case of a filament, the state parameter is a variable which varies due to a temporal change in the state of the filament during processing (e.g., a decrease in diameter of the filament). Such a variable (e.g., the diameter of the filament) may be monitored by a monitoring unit Z (e.g., a sensor), and stored as a monitored value in the monitored value storage part 84, as shown in FIG. 2.

Returning to FIG. 1, in some embodiments, the ion beam irradiation apparatus 100 may further include a machine learning device 9 that automatically determines, using the trained machine learning algorithm, the initial value of each basic parameter to be input by the basic parameter input part 82.

The machine learning device 9 is a computer comprising at least one CPU, a memory, a display, input means, such as a keyboard, mouse, trackpad, touch screen display, etc., and an artificial intelligence feature. In some embodiments, the machine learning device 9 may be implemented using the control device 8. In other words, in some embodiments, the functions of the machine learning part 9 may be performed by the control device 8. In other embodiments, the machine learning device 9 may be provided separately from the control device 8, and configured to, when the CPU of the machine learning device 9 and its peripherals are cooperatively operated according to machine learning program code stored in the memory of the machine learning device 9, execute the machine learning program code to perform functions of a learning data storage part 91, a machine learning part 92, an algorithm storage part 93, and a basic operation parameter output part 94 (hereinafter referred to as "basic parameter output part 94"), as shown in FIG. 2. These parts 91-94 will be described in more detail below.

In still other embodiments, unlike that shown in FIG. 1, the machine learning device 9 may be provided separately from the ion beam irradiation apparatus 100 as will be described further below. In this case, the machine learning device 9 may be communicatively coupled to the ion beam irradiation apparatus 100, for example, by wired or wireless connection.

Figure 3:
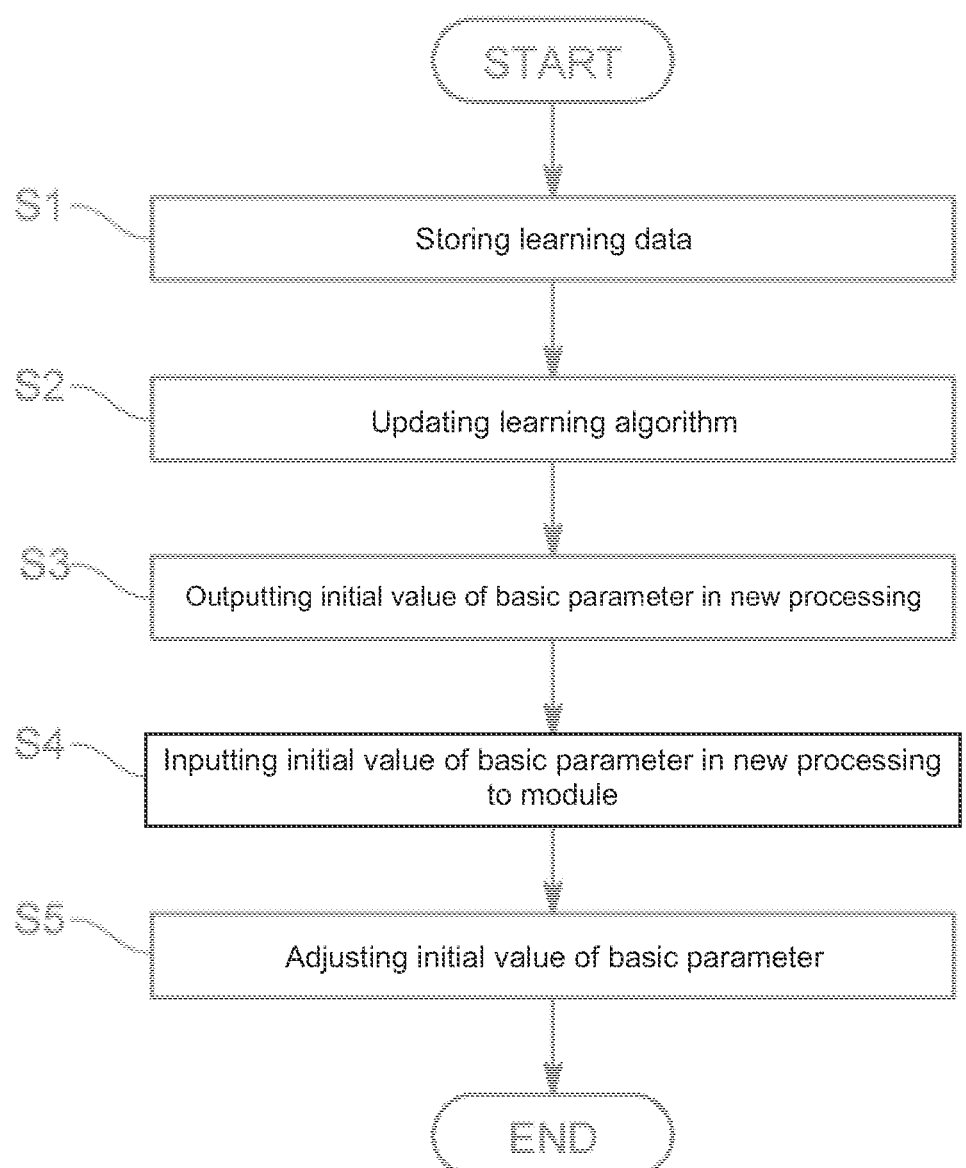
FIG. 3 is a flowchart showing operations of the control device and the machine learning device, according to an embodiment.
Figure 4:
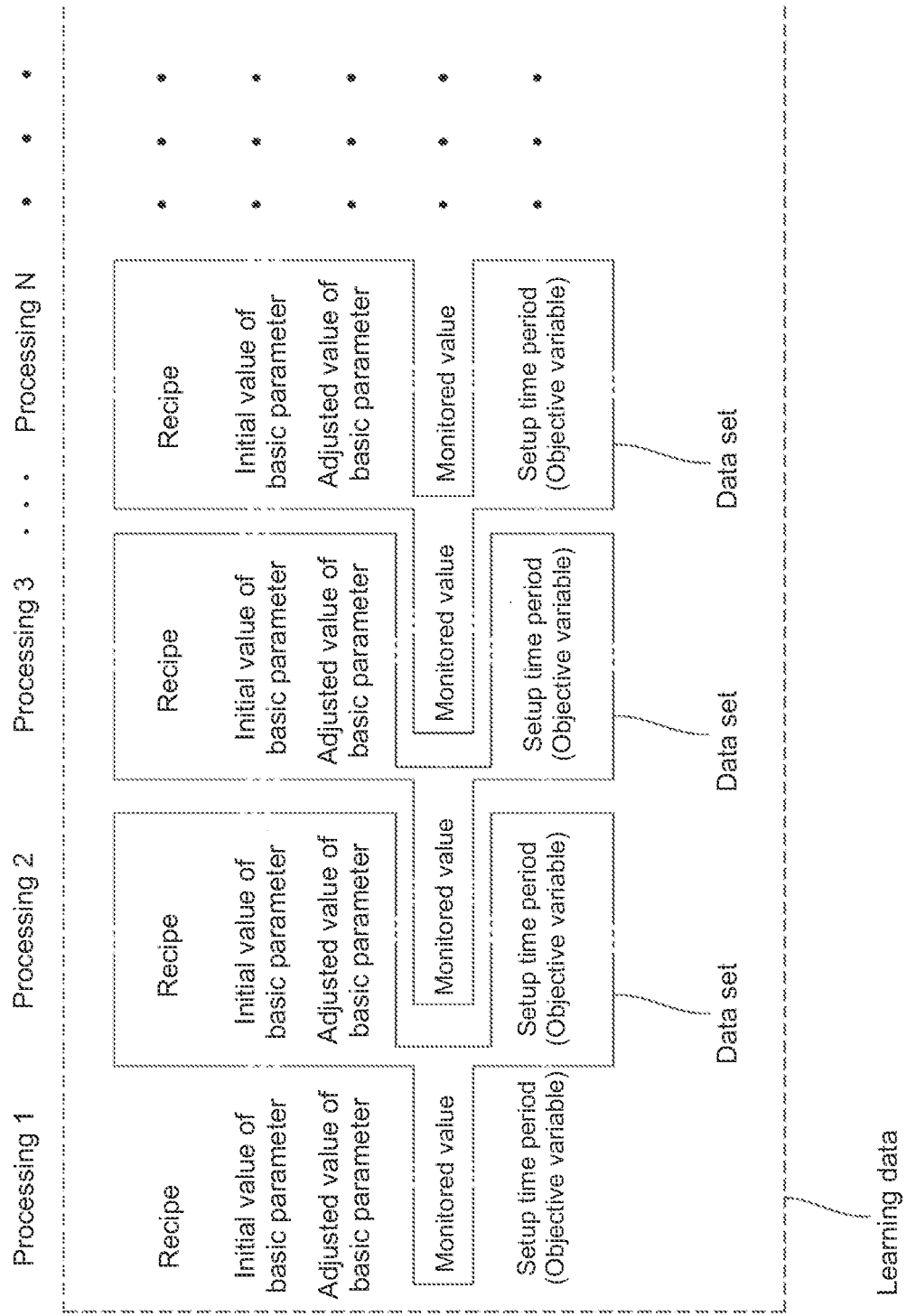
FIG. 4 is a diagram illustrating contents of learning data, according to an embodiment.
Figure 6:
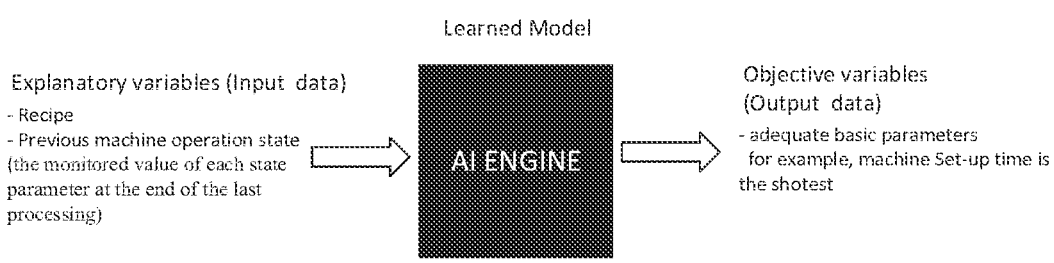
FIG. 6 is an explanatory diagram of an example of an artificial intelligence engine according to embodiments.

FIG. 3 is a flowchart showing operations of the control device and the machine learning device, according to an embodiment. FIG. 4 is a diagram illustrating contents of training data (i.e., learning data), according to an embodiment. FIG. 6 is an explanatory diagram of an example of an artificial intelligence engine according to embodiments.

With reference to the flowchart in FIG. 3 and the diagrams of FIGS. 4 and 6, setup of each module M using the machine learning device 9 will be described below, with reference to the functions of the parts 91 to 94.

Learning data for use in machine learning is stored in the learning data storage part 91 (S1). For example, in some embodiments, the learning data may be obtained, at least in part, from the monitored value storage part 84 described above.

For example, the learning data may be data obtained from a plurality of previous processings (e.g., Processing 1, Processing 2, Processing 3, Processing N in FIG. 4), and includes various actual values used in the plurality of previous processings. Specifically, as shown in FIG. 4, the learning data includes a plurality of data sets, each of which includes the recipe used in the processing, the initial value of each basic parameter input to a respective one of the modules M by the basic parameter input part 82 in the processing, the adjusted value of each basic parameter obtained through the adjustment by the basic parameter tuning part 83 in the processing, the monitored value of each state parameter of at least one of the modules M at the end of the processing, and an actual value of a given objective variable (i.e., a variable that is measured) in the processing, and in each data set, the recipe, initial value(s), adjusted value(s), monitored value(s), and objective variable are associated with each other. In a specific example, when Processing2 is performed (i.e., a very first Processing according to the first use of the recipe), the monitored value has no value. The monitored value in Processing1 is then used for Processing2 to determine adequate parameters for machine operation, as indicated by a block "Data set" in FIG. 4. As shown in FIG. 4, Processing 2 includes the recipe used in the Processing 2, the initial value of each basic parameter input to a respective one of the modules M in the Processing 2, the adjusted value of each basic parameter adjusted in the Processing 2, the monitored value of each state parameter of at least one of the modules M at the end of the Processing 1, and the actual value of the objective variable measured in the Processing 2. In other words, the monitored value in Processing 1 is used for Processing 2, as a part of data set for Processing 2. It should be noted here that the monitored value includes all or a portion of the adjusted values of the basic parameters, and further includes the variable monitored by the monitoring unit Z, as mentioned above. However, the monitored value is usable as long as the monitored value includes at least one of the adjusted values of each basic parameter and the variable monitored by the monitoring unit Z.

Then, among the plurality of pieces of data, in each of the processings, the processing condition (recipe), at least one of the initial value and the adjusted value of each basic parameter, the monitored value of the at least one module M in processing just before the processing (this processing will hereinafter be referred to as a "last processing"), and the actual value of the given objective variable, are associated with each other to form one data set, as shown by the boxes in FIG. 4. In the example illustrated in FIG. 4, the data set comprises both the initial value and the adjusted value of each basic parameter. Further, the data set as shown in FIG. 4 is not limited to this. For example, in some embodiments, in each of the processings, e.g., Processing 1 to Processing N, the data set may include other parameters for an explanatory variable such as a degree of vacuum in an ion beam path between an ion source and a chamber in which a target W is placed. The learning data includes a plurality of such data sets. It is noted that the each of the Processing 1 to Processing N illustrated in FIG. 4 means at least one process (e.g., Process A illustrated in FIG. 14) that, generally is a multiple wafer process as illustrated in FIG. 14.

The objective variable provides a basis for allowing the basic parameter output part 94 to output the initial value of each basic parameter for a new processing. In some embodiments, the objective variable may be a setup time period, i.e., a time period for starting new processing, and includes a tuning time period at least after the basic parameter tuning part 83 starts to adjust the initial value of each basic parameter and before the basic parameter tuning part 83 obtains the adjusted value thereof. That is, the setup time period may be a time from a time the basic parameter tuning part 83 sets the initial value to a time at which an adjustment of the initial value is finished.

The machine learning part 92 operates to update a learning algorithm (S2). For example, the machine learning part 92 operates to update a learning algorithm using, as an explanatory variable, at least a recipe accepted during new processing and a monitored value of the at least one of the modules M during a last processing just before the new processing, using the learning data stored in the learning data storage part 91. The learning model may be referred to as an artificial intelligence (AI) engine, as shown in FIG. 6.

The machine learning part 92 is a function brought out by the aforementioned artificial intelligence feature, and is configured to update the above learning algorithm, based on supervised learning, unsupervised learning, reinforcement learning or deep learning, etc.

The machine learning part 92 operates to store the updated learning algorithm in the algorithm storage part 93 set in a given region of the memory of the machine learning device 9. In some embodiments, the algorithm storage part 93 may be provided in an external memory, a crowd server or the like.

The initial value of the basic parameter in the new processing is output (S3). For example, when the recipe acceptance part 81 operates to accept a recipe during new processing, the basic parameter output part 94 operates to use the learning algorithm updated by the machine learning part 92 to output the initial value of each basic parameter during the new processing to the basic parameter input part 82, such that the objective variable meets a desired condition.

Specifically, the basic parameter output part 94 operates to acquire the recipe during the new processing, accepted by the recipe acceptance part 81, and the monitored value of the at least one module M during a last processing (i e, immediately prior to the new processing), stored in the monitored value storage part 84, to estimate the setup time period in the new processing. More specifically, the basic parameter output part 94 operates to acquire adjusted values of each basic parameter during a plurality of previous processings (e.g., during processing under the same recipe as that during the new processing, and during processing having a monitored value equal to or falling within a given range from that during the last processing); classify or evaluate setup time periods in a case where each of the adjusted values is input as the initial value during the new processing; and output a result of the classification/evaluation. Alternatively, in some embodiments, the basic parameter output part 94 may be configured to classify or evaluate setup time periods in a case where each of the initial values of each basic parameter during the plurality of previous processings is input as the initial value during the new processing, and output a result of the classification/evaluation.

In this case, the basic parameter output part 94 operates to acquire monitored values of each state parameter of the ion source system-module at the end of the last processing, specifically the adjusted value of each basic parameter and the filament voltage and filament current as the state parameters of the filament, during the last processing in the ion source system-module, and determine initial values of each basic parameter using the acquired monitored values. Alternatively, in some embodiments, the basic parameter output part 94 may be configured to acquire monitored values of each state parameter of an element of the ion source system-module other than the filament, the extraction electrode system-module, or the beam line electromagnetic field system-module, and determine initial values of each basic parameter using the acquired monitored values.

An initial value of a basic parameter is input in the new processing (S4). For example, among the initial values of each basic parameter, output from the basic parameter output part 94 in the above manner, one initial value determined, based on a given criterion, to be optimal, e.g., one initial value allowing the setup time period to become shortest, is input to the respective one of the module M through the basic parameter input part 82. In some embodiments, the determination of the initial value is performed by the basic parameter output part 94. Alternatively, in other embodiments, the determination may be performed by a computer (e.g., the control device 8) provided separately from the machine learning device 9, or may be performed by an operator.

The initial value of the basic parameter is adjusted (S5). For example, the adjustment of the initial value of each basic parameter may be performed by the basic parameter tuning part 83 as mentioned above, to complete the setup of the modules M.

In the ion beam irradiation apparatus 100 configured as above, the learning data includes the monitored value of each state parameter of the at least one module M in the last processing, so that it is possible to perform machine learning in consideration of the state of the at least one module M during last processing.

Therefore, by using a learning model updated by machine learning, it becomes possible to determine, during new processing, the initial value of each basic parameter, e.g., so as to allow the setup time period to become shortest.

Specifically, as a result of comparison between respective setup time periods in a case where the initial value of each basic parameter output from the machine learning device 9 is input to the respective one of the modules M and in a case where an existing parameter of each basic parameter in a related art apparatus is input to the respective one of the modules M, the setup time period in the ion beam irradiation apparatus 100 according to various embodiments was about one-half of that of a related art apparatus, which shows that the machine learning device 9 makes it possible to shorten the setup time period.

Among the plurality of modules M, the ion source system-module is often short in terms of usable life, and high in terms of maintenance or exchange frequency, as compared to the extraction electrode system-module and the beam line electromagnetic field system-module.

In this regard, the learning data may include the monitored value of each state parameter of at least the ion source system-module, so that it is possible to perform machine learning in consideration of the state of a last processing in the ion source whose state is likely to change, as compared with the remaining modules M, and adequately determine the initial value during new processing.

Further, the basic parameter of the ion source system-module may include the flow rate of gas to be supplied to the plasma chamber and the supply current to be supplied to the source magnet, each of which has a dominant influence on efficiency of the plasma generation, so that it becomes possible to adequately determine the initial value of each of the gas flow rate and the supply current to the source magnet, so as to efficiently generate plasma having difficulty in modeling.

Figure 5:
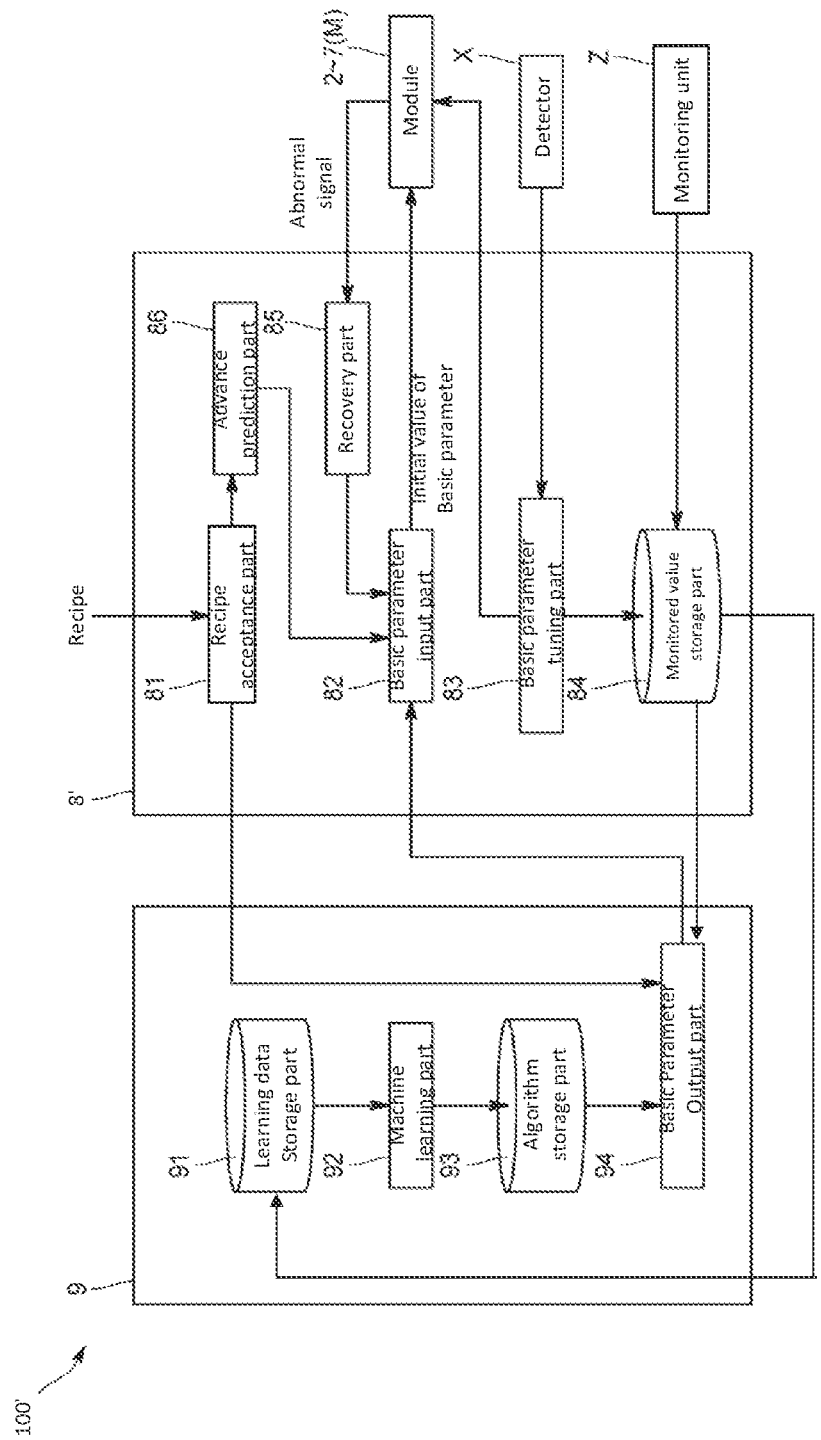
FIG. 5 is a functional block diagram showing functions of a control device and a machine learning device of an ion beam irradiation apparatus according to an embodiment.

FIG. 5 is a functional block diagram showing functions of a control device and a machine learning device of an ion beam irradiation apparatus according to an embodiment.

An ion beam irradiation apparatus 100' is different from the embodiment illustrated in FIGS. 1-4, in that the ion beam irradiation apparatus 100' (and specifically the control device 8') is configured to switch between a first mode of operation in which an initial value of each basic parameter obtained based on a learning algorithm is input to a respective one of a plurality of modules M and adjusted, in the same manner as that in the embodiment illustrated in FIGS. 1-4 (the first mode will hereinafter be referred to as an "AI basic parameter mode"), and a second mode of operation in which an initial value of each basic parameter selected by a control device 8' without relying on the AI basic parameter mode is input to the respective one of the modules M and adjusted (the second mode will hereinafter be referred to as "BC basic parameter mode").

The operation of the AI basic parameter mode is described above with respect to FIGS. 1-4. Thus, only the BC basic parameter mode will be described below.

Examples of the BC basic parameter mode may include a related art setup sequence that is executed in the control device 8'. Specifically, when a recipe acceptance part 81 is operable to accept a recipe, a basic parameter input part 82 operates to select, as the initial value of each basic parameter, an initial value preliminarily stored in a memory or the like according to each recipe, or an initial value used during previous processing under the same recipe as the accepted recipe, and input the selected initial value of each basic parameter to the respective one of the modules M.

Subsequently, a basic parameter tuning part 83 is operable to adjust the input initial value of each basic parameter such that an ion beam IB is generated in conformity to the recipe, thereby setting up the respective one of the modules M.

As shown in FIG. 5, the control device 8' may further include at least one of functions of a recovery part 85 or an advance prediction part 86.

The recovery part 85 is operable, when the setup of the modules M in the BC basic parameter mode is abnormally ended without being successfully completed, to acquire an abnormal signal indicative of that fact, and switch the module setup sequence from the BC basic parameter mode to the AI basic parameter mode.

Specifically, the recovery part 85 is operable, upon acquiring the abnormal signal, to switch the operation of the basic parameter input part 82 from the BC basic parameter mode to the AI basic parameter mode to cause the basic parameter input part 82 to re-input the initial value of each basic parameter to the respective one of the modules M. That is, the basic parameter input part 82 is operable to acquire the initial value of each basic parameter determined by a basic parameter output part 94 of a machine learning device 9 using a learning algorithm and outputted from the basic parameter output part 94, and input the acquired initial value of each basic parameter to the respective one of the modules M.

The recovery part 85 may be configured to, when the abnormal signal is still detected even after switching the operation of the basic parameter input part 82 from the BC basic parameter mode to the AI basic parameter mode, cause the basic parameter input part 82 to be operated in the AI basic parameter mode again. In this case, the basic parameter output part 94 is advantageously configured to output an initial value determined based on the state of an ion source system-module whose state is likely to change, as compared with the remaining modules M.

The advance prediction part 86 is operable, before start of the operation in the BC basic parameter mode, to predict, based on the recipe accepted by the recipe acceptance part 81, whether the setup of the modules M according to the BC basic parameter mode will be successfully completed.

Specifically, the advance prediction part 86 is operable to determine, e.g., whether or not one or more of the following phenomena occur, and, when one or more of the following phenomena are determined to occur, determine that the setup according to the BC basic parameter mode is highly probable to fail to be successfully completed.

Phenomenon 1: The same recipe as the accepted recipe has not be previously accepted for a given period of time (e.g., for one month).

Phenomenon 2: In processing one or more processing cycles before, under the same recipe as the accepted recipe, a given actual value (e.g., the beam current amplitude of the ion beam IB, the beam angle of the ion beam IB, and/or the beam current density of the ion beam IB) is out of a given numerical range. The given numerical range may be preset.

Phenomenon 3: In processing one or more processing cycles before, under the same recipe as the accepted recipe, the setup according to the BC basic parameter mode failed to be successfully completed.

Phenomenon 4: Processing one or more processing cycles before, under the same recipe as the accepted recipe, was performed once or a given numbers of times in a state exposed to the atmosphere.

When it is predicted that the setup of the modules M will be successfully completed according to the BC basic parameter mode (i.e., when none of the above described phenomena are determined to occur), the advance prediction part 86 is operable to cause the basic parameter input part 82 to be operated according to the BC basic parameter mode.

On the other hand, when it is predicted that the setup of the modules M will fail to be successfully completed according to the BC basic parameter mode (i.e., when at least one of the above-described phenomena is determined to occur), the advance prediction part 86 is operable to cause the basic parameter input part 82 to be operated according to the AI basic parameter mode.

In the ion beam irradiation apparatus according to the embodiment illustrated in FIG. 5, the BC basic parameter mode may be used for a recipe under which the setup could be completed within a relatively short period of time with respect to a past record, and the AI basic parameter mode may be used for a recipe under which it takes a relatively long period of time for completing the setup.

This makes it possible to introduce the setup operation based on the AI basic parameter mode without largely modifying an existing setup sequence, to achieve further shortening of the setup time period and further improvement in setup success rate, as compared with the related art apparatus.

Embodiments are not limited to the various embodiments described above.

For example, although the above embodiments have been described based on an example where the objective variable is the setup time period, the objective variable may be an index value indicative of whether or not the adjusted value is obtained, i.e., an index value indicative of whether or not the setup has been completed; the beam current amplitude of the ion beam IB; the beam angle of the ion beam IM; or the beam current density of the ion beam IB.

Further, the basic parameter output part 94 may be configured to output the initial value of each basic parameter, e.g., such that the setup time period falls within a given time period, and the quality of the ion beam IB, such as the beam current amplitude of the ion beam IB, the beam angle of the ion beam IM or the beam current density of the ion beam IB, meets a given condition.

The machine learning device 9 may have a function of an objective variable estimation part to estimate the objective variable (e.g., the setup time period) in new processing, based on the learning algorithm updated using the learning data.

The above embodiments have been described based on an example where the monitored value of each state parameter at the end of the last processing is used as the explanatory variable. Alternatively, the monitored value of each state parameter in the middle of the last processing may be used as the explanatory variable.

In some embodiments, the control device 8' may be configured to have a portion or all of the functions of the machine learning device 9.

The parts 81-86 and parts 91-94 described above may be implemented as program code that may be executed using various computer components and may be recorded on a computer readable storage medium. The computer readable storage medium may include a program command, a data file, a data structure, etc., alone or in combination. Examples of the computer readable storage medium may include magnetic storage media (e.g., hard disks, floppy disks, magnetic media such as magnetic tapes, etc.), optical recording media (e.g., CD-ROMs or DVDs), magneto-optical media (e.g., floptical disks), and hardware devices specifically configured to store and execute program commands (e.g., ROM, RAM, flash memories, etc.). Examples of the program code may include mechanical codes prepared by a compiler, and high-level languages executable by a computer by using an interpreter.

Figure 7:
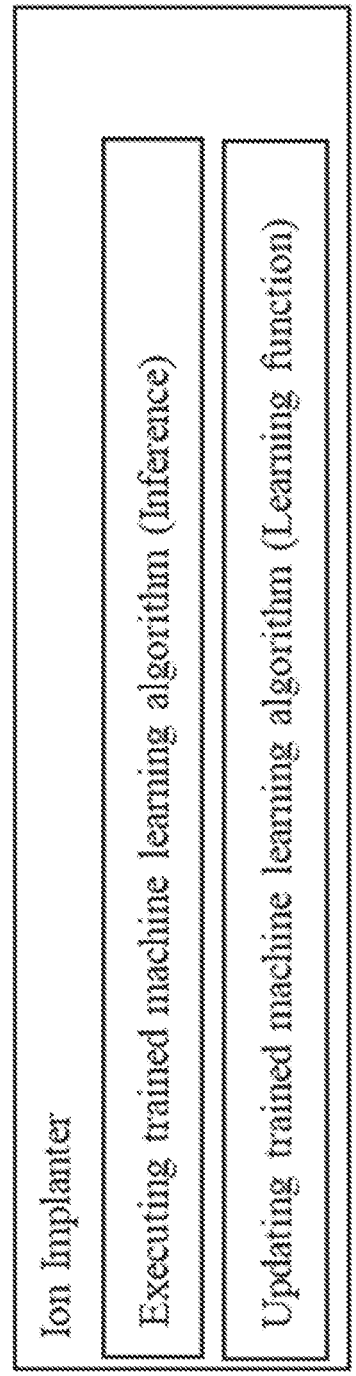
FIG. 7 is a high level functional block diagram a configuration of an ion beam irradiation apparatus according to an embodiment.

FIG. 7 is a high level functional block diagram a configuration of an ion beam irradiation apparatus according to an embodiment. As illustrated in FIG. 7, an ion implanter according to some embodiments may both execute a trained machine learning algorithm in order to determine an initial value of a basic operation parameter of one or more modules, as an inference function, and update the trained machine learning algorithm that is executed. In other words, the ion implanter both performs training to the trained machine learning algorithm from various learning data, and executes the trained machine learning algorithm in order to predict the initial value. However, embodiments are not limited thereto.

Figure 8:
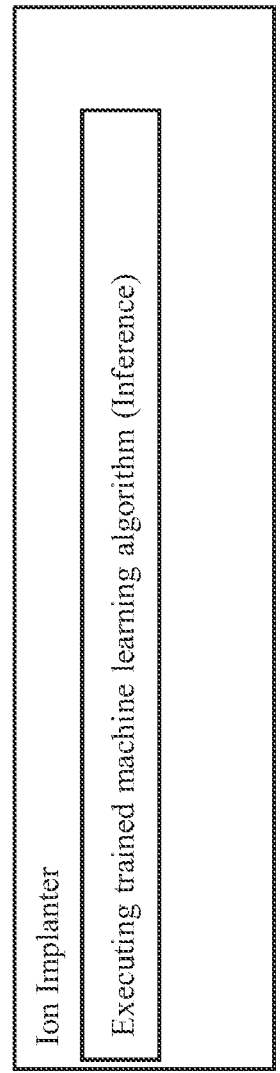
FIG. 8 is a high level functional block diagram of a configuration of an ion beam irradiation apparatus according to another embodiment.

FIG. 8 is a high level functional block diagram of a configuration of an ion beam irradiation apparatus according to another embodiment. As illustrated in FIG. 8, in some embodiments, unlike that shown in FIG. 7, the ion implanter may only execute the trained machine learning algorithm to perform the inference function. That is, the ion implanter (e.g., the ion beam irradiation apparatus 100) may simply store the trained machine learning algorithm and may only execute the trained machine learning algorithm in order to predict the initial value without performing training. For example, in some embodiments, the control device 8 of the ion beam irradiation apparatus 100 may simply access the trained machine learning algorithm that is stored in the machine learning part 9 and use the trained machine learning algorithm to predict the initial value.

Figure 9:
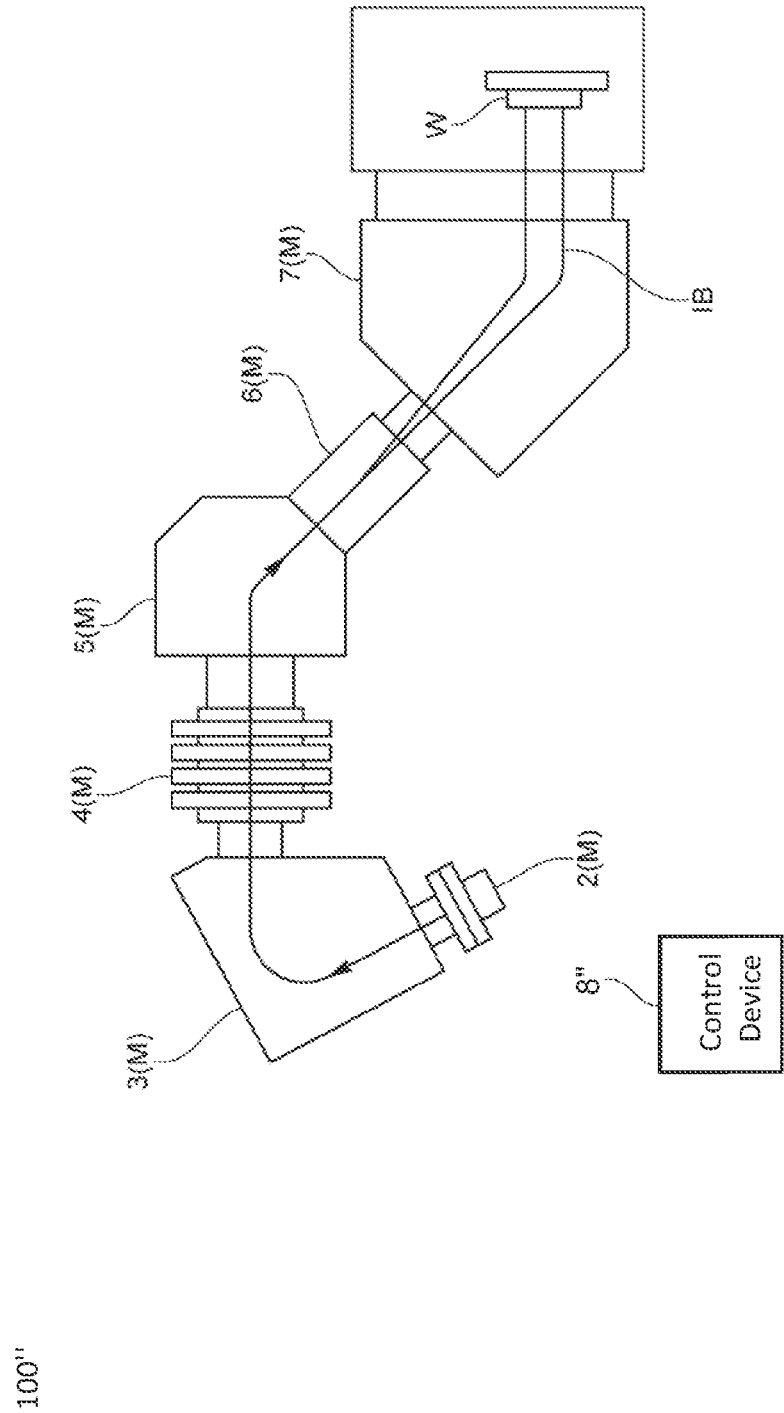
FIG. 9 is a schematic diagram showing a configuration of an ion beam irradiation apparatus according to another embodiment.
Figure 10:
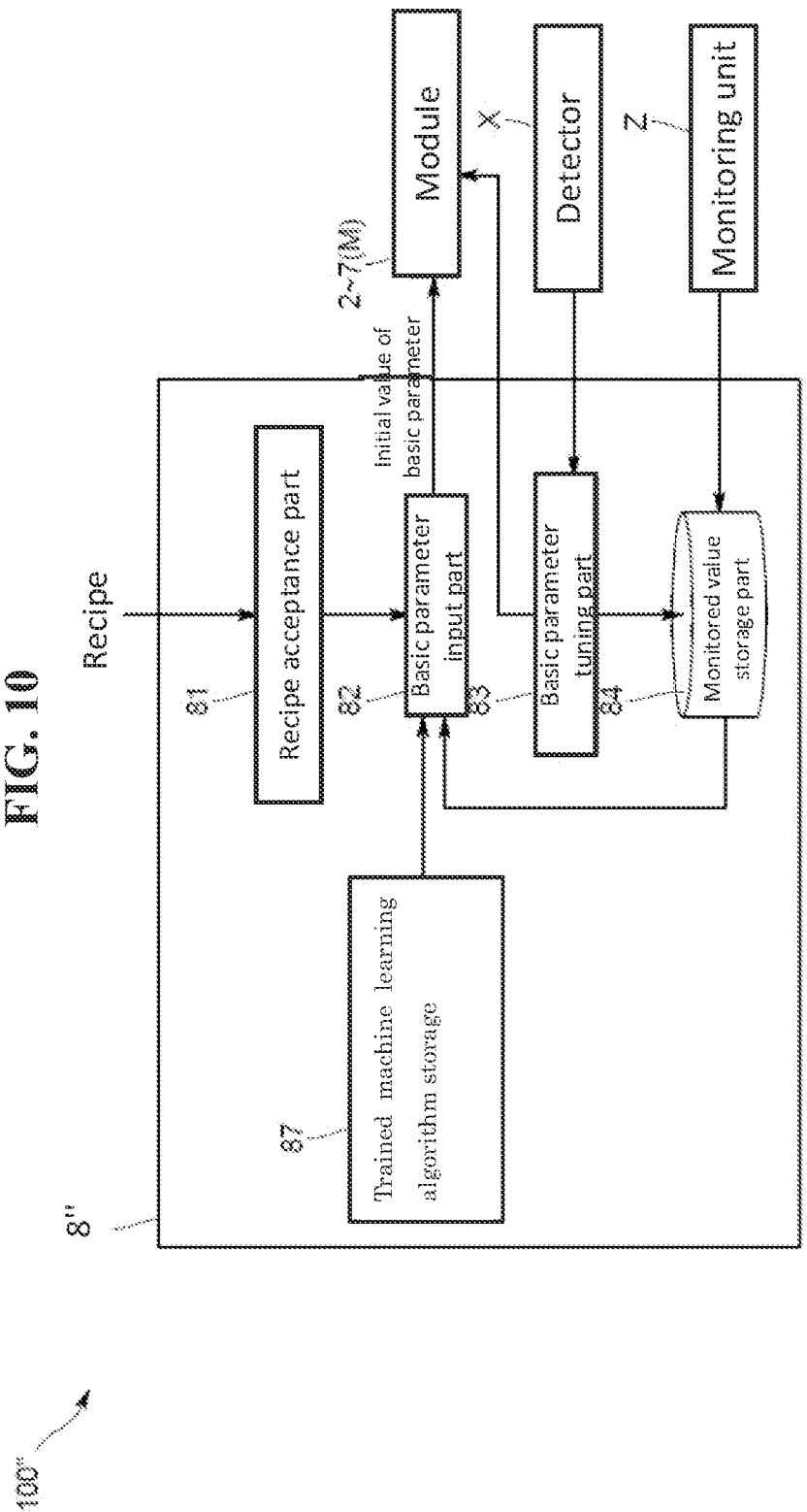
FIG. 10 is a functional block diagram showing functions of a control device, according to an embodiment.

FIG. 9 is a schematic diagram showing a configuration of an ion beam irradiation apparatus according to another embodiment. FIG. 10 is a functional block diagram showing functions of a control device of the ion beam irradiation apparatus of FIG. 9, according to an embodiment.

As illustrated in FIG. 9, an ion beam irradiation apparatus 100" may include a plurality of modules which are used for generating the ion beam IB. The plurality of modules may include the ion source 2, the mass separation magnet 3, the acceleration tube 4, the energy separation magnet 5, the scanning magnet 6, and the beam parallelizing magnet 7, and a control device 8" for controlling operations of the modules 2 to 7. In other words, the ion beam irradiation apparatus 100" may be similar to the ion beam irradiation apparatus 100 described with respect to FIG. 1, except that the machine learning part 9 is omitted. In FIG. 9, like reference numbers refer to like components and repeated description thereof is omitted for conciseness. As with the ion beam irradiation apparatus 100 illustrated in FIG. 1, the ion beam irradiation apparatus 100" is not limited an ion implantation apparatus and, in some embodiments, may be, for example, an ion beam etching apparatus.

As illustrated in FIG. 10, the control device 8" may include the recipe acceptance part 81, the basic parameter input part 82, the basic parameter tuning part 83, the monitored value storage part 84, and a trained machine learning algorithm storage 87. The recipe acceptance part 81, the basic parameter input part 82, the basic parameter tuning part 83, and the monitored value storage part 84 are similar to those described with reference to FIG. 2 and thus a repeated description thereof is omitted for conciseness. The trained machine learning algorithm storage 87 may store a trained machine learning algorithm. For example, the trained machine learning algorithm storage 87 may receive the trained machine learning algorithm from outside of the ion beam irradiation apparatus 100". For example, in some embodiments, the trained machine learning algorithm storage 87 may receive the trained machine learning algorithm from a machine learning part located outside of the ion beam irradiation apparatus 100" and store the received trained machine learning algorithm. The control device 8" may input a processing condition during new processing (e.g., from a recipe) and a monitored value indicative of a state of a module during processing immediately before the new processing (i.e., detected from the module) to the trained machine learning algorithm and may receive as an output from the trained machine learning algorithm an initial value of a basic operation parameter for controlling an operation of the module, and output the initial value of the basic operation parameter for controlling the operation of the module, to the module.

More specifically, the basic parameter input part 82 may receive the recipe from the recipe acceptance part 81 and may receive the monitored value indicative of the state of the module during processing immediately before the new processing from the monitored value storage part 84, and may access the trained machine learning algorithm storage 87 and may input the processing condition during new processing (e.g., from the recipe) and the monitored value indicative of the state of the module during processing immediately before the new processing (i.e., detected from the module) to the trained machine learning algorithm and may receive as the output from the trained machine learning algorithm the initial value of the basic operation parameter for controlling the operation of the module, and output the initial value of the basic operation parameter for controlling the operation of the module, to the module. The structures and functions of the remaining components of the control device 8" of FIG. 10 are similar to that of the like components discussed with reference to FIG. 2 and thus repeated description thereof is omitted for conciseness.

Figure 11:
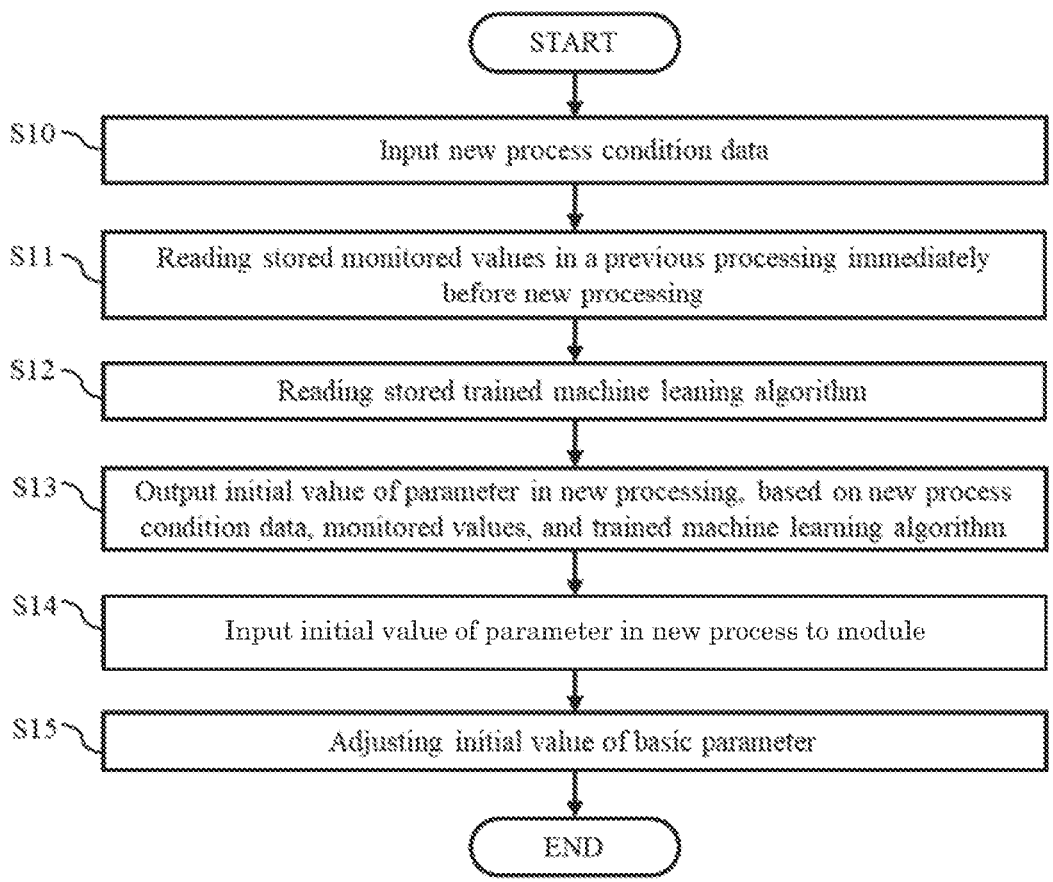
FIG. 11 is a flowchart showing operations of the control device, according to an embodiment.

FIG. 11 is a flowchart showing operations of the control device, according to an embodiment. The operations illustrated in FIG. 11 may be performed by the control device 8' of FIGS. 9-10.

New process condition data may be input (S10). For example, the control device 8' may receive a recipe including process condition data. As described above, the recipe acceptance part 81 may receive a recipe including a processing condition for processing a workpiece (i.e., a to-be-processed object). The recipe includes a variety of information indicative of the quality of the ion beam TB generated by the ion beam irradiation apparatus 100 such as an ion species of dopant ions included in the ion beam TB, the beam energy of the ion beam TB, and/or the beam current of the ion beam IB.

Monitored values in a previous processing immediately before the new processing may be read (S11). For example, the control device 8" may read the monitored values from the monitored value storage part 84.

A trained machine learning algorithm may be read (S12). For example, the control device 8" may access the trained machine learning algorithm storage 87 and may read the trained machine learning algorithm that is stored in the trained machine learning algorithm storage 87. More specifically, the basic parameter input part 82 may access the trained machine learning algorithm storage 87 and may read the trained machine learning algorithm that is stored in the trained machine learning algorithm storage 87.

An initial value of a parameter in the new processing may be output based on the new process condition data, the monitored values, and the trained machine learning algorithm. For example, the basic parameter input part 82 of the control device 8" may input the new processing condition data (e.g., from a recipe) and the monitored values in the previous processing immediately before the new processing to the trained machine learning algorithm and may receive as an output from the trained machine learning algorithm an initial value of a basic operation parameter for controlling an operation of the module.

The initial value of the parameter in the new processing may be input (S14). For example, the basic parameter input part 82 of the control device 8" may input the initial value of the basic operation parameter for controlling the operation of the module, to the module.

The initial value of the parameter may be adjusted (S15). For example, the basic parameter tuning part 83 of the control device 8" is operable to adjust (tune) the initial value of each basic parameter input to the basic parameter input part 82. Specifically, the basic parameter tuning part 83 may adjust the initial value of each of one or more basic parameters on a case-by-case basis so as to allow a generated ion beam IB to meet the processing condition, i.e., so as to allow an ion beam IB to be generated in conformity to the recipe, thereby setting up the respective one of the modules M.

More specifically, the basic parameter tuning part 83 may adjust the basic parameter in accordance with a preliminarily set setup sequence. Then, each of the modules M is operated based on an adjusted value of the basic parameter finally obtained through the setup sequence. For example, the setup sequence may include a plurality of steps, and may include a plasma generation step of generating plasma inside the plasma chamber; an extraction step of extracting an ion beam IB by the extraction electrode system; a beam adjustment step of performing acceleration/deceleration and trajectory adjustment of the ion beam IB; and a beam measurement step of measuring a beam current magnitude, a beam angle, a beam current density or the like of the ion beam IB. As shown in FIG. 10, one or more detectors X, such as a beam detector (e.g., a Faraday cup), may be provided to detect various detection values of the ion beam IB. The detected values are then fed back to the basic parameter tuning part 83. The basic parameter tuning part 83 is operable to feedback-control the value of the basic parameter such that the detection value detected in each step by each of various detectors X such as a beam detector (e.g., Faraday cup) converges to a given target value.

Figure 12:
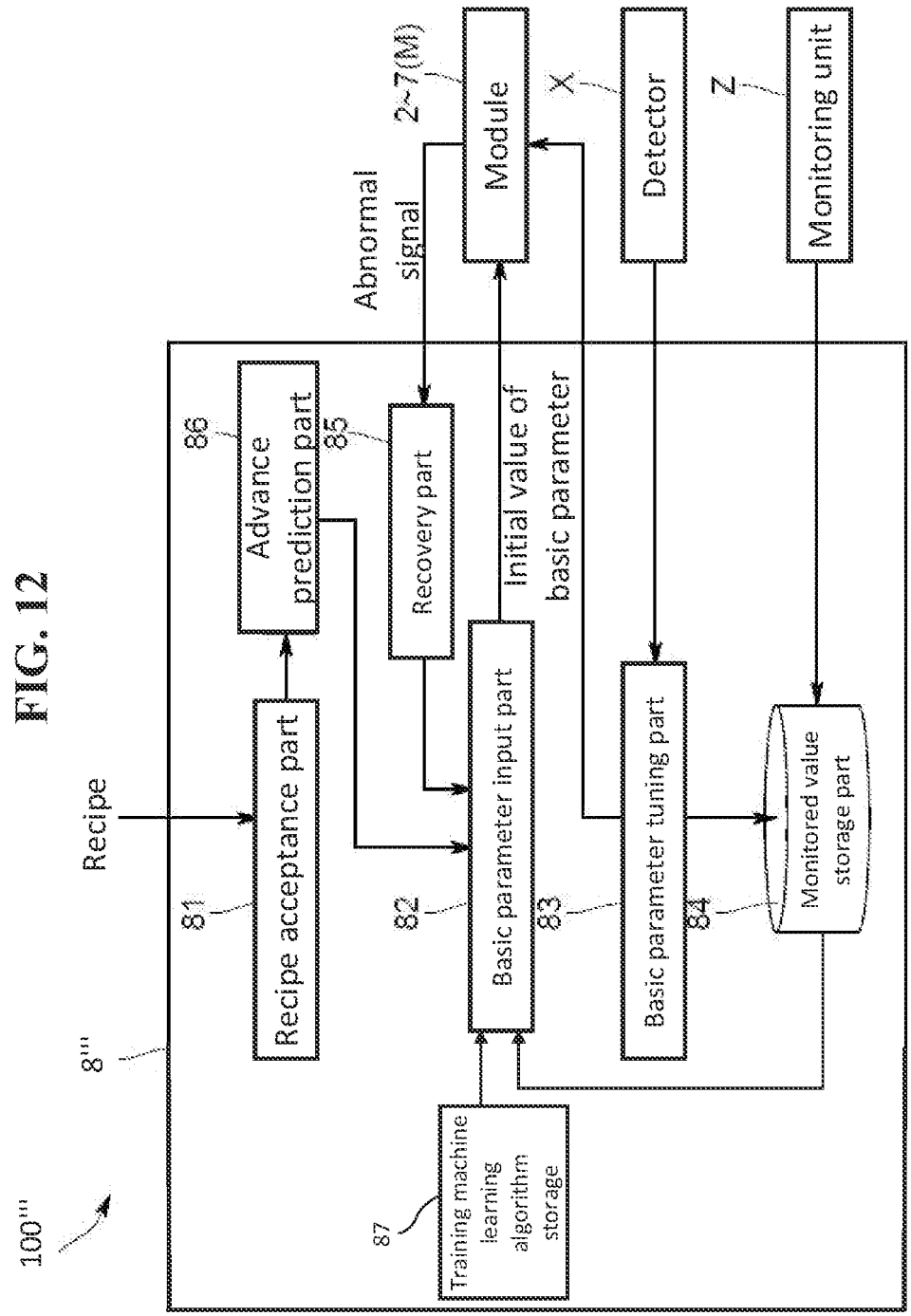
FIG. 12 is a functional block diagram showing functions of a control device of an ion beam irradiation apparatus according to an embodiment.

FIG. 12 is a functional block diagram showing functions of a control device 8''' of an ion beam irradiation apparatus 100''', according to an embodiment. The functional block diagram is similar to that of FIG. 5, except that the basic parameter input part 82 accesses the trained machine learning storage 87 to read the trained machine learning algorithm therefrom.

The remaining components in FIG. 12 have the same structure and functions as the corresponding components in FIG. 5 and therefore repeated description thereof is omitted for conciseness.

Figure 13:
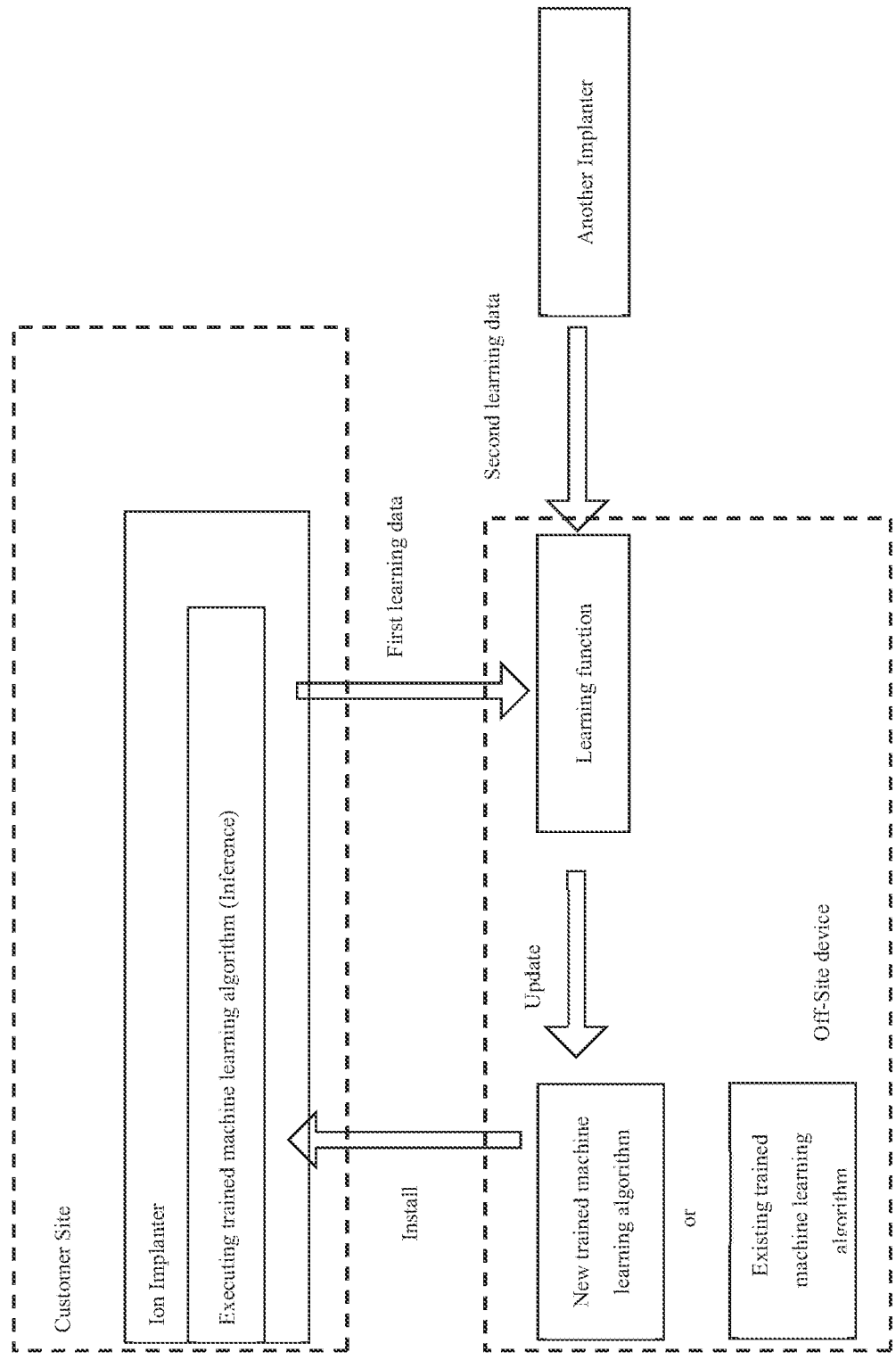
FIG. 13 is a diagram illustrating an example of an environment of the ion beam irradiation apparatus of FIGS. 8-12, according to an embodiment.

FIG. 13 is a diagram illustrating an example of an environment of the ion beam irradiation apparatus of FIGS. 8-12, according to an embodiment. As illustrated in FIG. 13, the environment may include one or more customer sites communicatively coupled to an off-site device. It is noted that FIG. 13 only illustrates one customer site by way of example. Additional customer sites have a similar configuration as the customer site illustrated in FIG. 13, and thus a repeated description thereof is omitted for conciseness.

Each of the one or more customer sites may comprise an ion implanter (e.g., the ion beam irradiation apparatus 100" or the ion beam irradiation apparatus 100'''). That is, an ion implanter (e.g., the ion beam radiation apparatus 100" or the ion beam irradiation apparatus 100') may be installed at the customer site.

The off-site device may be located off-site from the customer site. For example, in some embodiments, the off-site device may comprise an implementation of the machine learning part 9 described above. In some embodiments, the off-site device may be located at a site of a manufacturer of the ion implanter that is installed in the customer site. In other embodiments, the off-site device may be an ion implanter (e.g., the ion beam radiation device 100) located at another customer site. Alternatively, or additionally, the off-site device may be a cloud computing device or a cloud computing system configured to implement one or more functions of the machine learning part.

The ion implanter installed at the customer site may execute a trained machine learning algorithm that is installed on the ion implanter to perform an inference function to determine an initial value of a basic operation parameter of one or more modules of the ion implanter, may set up the one or more modules based on the initial value, may adjust/tune the initial value in order that the adjusted value converges to a given target value according to a recipe, and may store monitored values in the process. The ion implanter may generate first learning data, and provide the first learning data to the off-site device. As described above, the first learning data may include a plurality of data sets in each of which the processing condition in each of the processings, at least one of the initial value and the adjusted value for the respective one of the modules in each of the processings, the monitored value of the at least one module during processing just before each of the processings, and the actual value of a given objective variable in each of the processings are associated with each other, as discussed above.

The off-site device may receive the first learning data and perform a learning function based on the first learning data to update a trained machine learning algorithm. For example, the off-site device may train a machine learning algorithm using the first learning data to update the trained machine learning algorithm.

The off-site device may install the trained machine learning algorithm that is updated on the ion implanter at the customer site. For example, the off-site device may transmit the trained machine learning algorithm to the ion implanter at the customer site, where the trained machine learning algorithm may be installed on the ion implanter. In this way, the trained machine learning algorithm on the ion implanter may be periodically updated or updated on demand, based on newly updated learning data. In some embodiments, an existing trained machine learning algorithm may be installed. The existing trained machine learning algorithm may be installed in a situation where, for example, there is a problem with the updated trained machine learning algorithm, and/or at a time when the ion implanter is first installed in the customer site, etc.

In some embodiments, the off-site device may receive second learning data from another ion implanter. For example, the another ion implanter may be installed at another customer site. In some embodiments, the off-site device may receive the second learning data from the another ion implanter in a situation in which the first learning data is not available or otherwise cannot be obtained from the ion implanter by the off-site device. In this configuration, the off-site device may receive the second learning data, and may perform the learning function based on the second learning data to update the trained machine learning algorithm. For example, the off-site device may train a machine learning algorithm using the second learning data to update the trained machine learning algorithm. For example, in some embodiments, the trained machine learning algorithm may correspond to the trained machine learning algorithm described above. The off-site device may install the trained machine learning algorithm that has been updated on one or more of the ion implanter and the another ion implanter. It should be noted that, while only one another ion implanter is illustrated and described with respect to FIG. 13, the number of additional ion implanters is not limited. In some embodiments, the off-site device may receive a plurality of learning data from a plurality of ion implanters installed at various customer sites and may perform the learning function to update the trained machine learning algorithm based on the plurality of learning data, and may install the trained machine learning algorithm on one or more of the plurality of ion implanters thus updating the trained machine learning algorithm on the one or more of the plurality of ion implanters.

It should be understood that the present disclosure is not limited to the above embodiments, but various other changes and modifications may be made therein without departing from the spirit and scope thereof as set forth in appended claims.

What is claimed is:

1. An ion beam irradiation apparatus comprising:
a plurality of modules for generating an ion beam according to a recipe; and
a control device configured to:
receive the recipe including a processing condition for new processing,
read, from a monitored value storage, a monitored value that indicates a state of a module of the plurality of modules during a last processing immediately before the new processing;
input the processing condition and the monitored value to a trained machine learning algorithm and receive, as an output from the trained machine learning algorithm, an initial value for the module, and
output the initial value to the module to set up the module for generating the ion beam.

2. The ion beam irradiation apparatus as recited in claim 1, wherein the module is operated based on an adjusted value obtained by adjusting the initial value.

3. The ion beam irradiation apparatus as recited in claim 2, wherein the control device is further configured to store, in a storage, the processing condition, the initial value, and the adjusted initial value in association with each other, as learning data.

4. The ion beam irradiation apparatus as recited in claim 1, further comprising a machine learning part configured to update the trained machine learning algorithm based on a plurality of data sets, each data set including, as an explanatory variable, a processing condition during new processing and a monitored value that indicates a state of at least one of the modules during a last processing immediately before the new processing.

5. The ion beam irradiation apparatus as recited in claim 1, wherein the control device is configured to receive the trained machine learning algorithm from an off-site device that is located at a location different from a location of the ion beam irradiation apparatus.

6. The ion beam irradiation apparatus as recited in claim 1, wherein the control device is further configured to:
based on the processing condition and a setup sequence, select an initial value of a basic operation parameter;
input the selected initial value to one of the plurality of modules; and
adjust the input initial value to setup the one of the plurality of modules.

7. The ion beam irradiation apparatus as recited in claim 6, wherein the control device is further configured to, when the setup of the one of the plurality of modules fails to be completed, acquire an abnormal signal indicative of the failure, and based on the abnormal signal, output the initial value from the trained machine learning algorithm to the one of the plurality of modules.

8. The ion beam irradiation apparatus as recited in claim 6, wherein the control device is further configured to, based on the initial value of the basic operation parameter, predict whether or not the setup of the one of the plurality of modules will be completed, and
based on predicting that the setup will not be completed, output the initial value from the trained machine learning algorithm to the one of the plurality of modules.

9. The ion beam irradiation apparatus as recited in claim 1, wherein the last processing comprises a plurality of processes corresponding respectively to a plurality of wafers, the monitored value being changed as the plurality of processes are performed on the plurality of wafers, and
wherein the monitored value that is stored is a monitored value after completing a processing of the plurality of processes in a last quartile of the plurality of processes that are performed on the wafers in the last processing.

10. The ion beam irradiation apparatus as recited in claim 1, wherein the last processing comprises a plurality of processes corresponding respectively to a plurality of wafers, the monitored value being changed as the plurality of processes are performed on the plurality of wafers, and
wherein the monitored value that is stored is a monitored value after completing a last process of the plurality of processes on a last wafer of the last processing.

11. A non-transitory computer readable storage medium storing program code which, when executed by at least one central processing unit (CPU) of an ion beam irradiation apparatus that includes a plurality of modules for generating an ion beam according to a recipe, causes the CPU to:
receive the recipe including a processing condition for new processing,
read a monitored value that indicates a state of a module of the plurality of modules during a last processing immediately before the new processing;
input the processing condition and the monitored value to a trained machine learning algorithm and receive, as an output from the trained machine learning algorithm, an initial value for the module, and
output the initial value to the module to set up the module for generating the ion beam.

12. The non-transitory computer readable storage medium as recited in claim 11, wherein the at least one CPU is further configured to:
operate the module based on the initial value,
obtain an adjusted value based on adjusting the initial value, and
store the adjusted value.

13. The non-transitory computer readable storage medium as recited in claim 12, wherein the at least one CPU is further configured to store, in a storage, the processing condition, the initial value, and the adjusted initial value in association with each other, as learning data.

14. The non-transitory computer readable storage medium as recited in claim 11, wherein the at least one CPU is further configured to receive the trained machine learning algorithm from an off-site device that is located at a location different from a location of the ion beam irradiation apparatus.

15. The non-transitory computer readable storage medium as recited in claim 11, wherein the last processing comprises a plurality of processes corresponding respectively to a plurality of wafers, the monitored value being changed as the plurality of processes are performed on the plurality of wafers, and
wherein the monitored value that is stored is a monitored value after completing a processing of the plurality of processes in a last quartile of the plurality of processes that are performed on the wafers in the last processing.

16. The non-transitory computer readable storage medium as recited in claim 11, wherein the last processing comprises a plurality of processes corresponding respectively to a plurality of wafers, the monitored value being changed as the plurality of processes are performed on the plurality of wafers, and
wherein the monitored value that is stored is a monitored value after completing a last process of the plurality of processes on a last wafer of the last processing.

17. A system comprising:
a plurality of ion implanters, each ion implanter comprising a plurality of modules and each ion implanter configured to:
setup at least one module of the plurality of modules according to an initial value obtained from a trained machine learning algorithm based on a processing condition for a new processing and a monitored value that indicates a state of the at least one module during a last processing immediately before the new processing, and
store learning data including the processing condition, the initial value, and an adjusted value obtained by adjusting the initial value during the setup, in association with each other; and
an off-site device communicatively coupled to the plurality of the ion implanters, the off-site device configured to receive the learning data from at least one of the plurality of ion implanters and update the trained machine learning algorithm based on the learning data.

18. The system as recited in claim 17, wherein the plurality of ion implanters are installed at respective customer sites, and the off-site device is located at a site of a manufacturer of the plurality of ion implanters.

19. The system as recited in claim 17, wherein the off-site device is co-located with one of the plurality of ion implanters.

20. The system as recited in claim 17, wherein the last processing comprises a plurality of processes corresponding respectively to a plurality of wafers, the monitored value being changed as the plurality of processes are performed on the plurality of wafers, and wherein the monitored value that is stored is a monitored value after completing a last process of the plurality of processes on a last wafer of the last processing.

* * * * *